United States Patent [19]

Flutie

[11] 3,906,133

[45] Sept. 16, 1975

[54] NITROCELLULOSE PROTECTIVE COATING ON MASKS USED IN IC MANUFACTURE

[75] Inventor: Richard E. Flutie, Melbourne Beach, Fla.

[73] Assignee: Harris Corporation, Cleveland, Ohio

[22] Filed: Apr. 23, 1974

[21] Appl. No.: 463,311

[52] U.S. Cl. .................. 428/172; 96/36.2; 96/38.3; 96/87 R; 427/82; 427/96; 428/203

[51] Int. Cl.$^2$ .......................................... G03C 5/00

[58] Field of Search .................. 96/87 R, 38.3, 36.2; 428/172, 203; 427/82, 96

[56] References Cited

UNITED STATES PATENTS

| | | | |
|---|---|---|---|
| 1,946,005 | 2/1934 | Steele | 96/87 R |
| 1,981,425 | 11/1934 | McNally | 96/87 R |
| 1,984,416 | 12/1934 | McNally et al. | 96/87 R |
| 3,508,982 | 4/1970 | Shearin | 96/38.3 |
| 3,573,975 | 9/1971 | Ohaka et al. | 117/212 |
| 3,674,492 | 7/1972 | Goldrick et al. | 96/68 |
| 3,715,244 | 2/1973 | Szupillo | 117/93.3 |
| 3,758,326 | 9/1973 | Hennings et al. | 117/37 R |

OTHER PUBLICATIONS

Rothman et al., IBM Technical Disclosure Bulletin, Vol. 14, No. 3, p. 743, (1971).

*Primary Examiner*—Michael Sofocleous

*Attorney, Agent, or Firm*—Fidelman, Wolffe & Leitner

[57] ABSTRACT

A photomask used in making integrated circuits consisting of a transparent substrate, such as glass having an iron oxide layer, is coated with nitrocellulose to protect said layer. The nitrocellulose coating prevents damage to the iron oxide layer caused by protuberances or dendrites projecting through the photoresist layer on a silicon wafer in contact with the photomask, and prevents sticking between the photoresist and the iron oxide.

16 Claims, No Drawings

NITROCELLULOSE PROTECTIVE COATING ON MASKS USED IN IC MANUFACTURE

BACKGROUND OF THE INVENTION

1. Field of the Invention

This invention concerns protecting a masking layer, e.g., iron oxide, on a transparent substrate, both comprising a photomask, from damage during integrated circuit (IC) and manufacturing processes.

2. Description of the Prior Art

In making ICs by contact printing, the following procedure is common: A silicon wafer is coated with a suitable photoresist and a photomask is then superimposed thereon. The composite is then exposed to light until the exposed photoresist is insolubilized or "hardened" in the case of a negative acting resist. A suitable solvent is employed to wash away the soluble photoresist, and the exposed areas are etched to remove part of the silicon substrate.

However, the silicon wafer often contains dendrites or protuberances on its surface which project through the photoresist coating. These then can come in contact with the masking layer on the photomask with possible harmful results in that the masking layer may become scratched. In addition, the photoresist layer on the wafer often sticks to the masking layer, resulting in a poor parting operation.

This problem has been recognized and various solutions proposed. U.S. Pat. No. 3,674,492 states that it is often difficult to obtain absolute contact between the mask and the resist over the entire area of interest. The patent remedies the deficiencies arising therefrom by having the photomask include a resist layer and a photographic emulsion layer.

Proprietary formulations are commercially available to coat the surface of the photomask. While their compositions are not known precisely, they appear to be water dispersions of coating agents. However, their effects are not of long duration and they do not give the lasting protection needed for the repetitive use of the photomask as required in a manufacturing process.

It has been suggested that lubricating fluids be interposed between the mask and the substrate during alignment and exposure. Lower alcohols have also been suggested (U.S. Pat. No. 3,573,975). However, the use of such liquids does not prevent the contact of dendrites and protuberances on the silicon wafer with the photomask and damage thereto can still occur.

SUMMARY OF THE INVENTION

The present invention coats the masking layer on the photomask, which is preferably a hard surface layer, such as iron oxide, with a film of nitrocellulose. The thickness of the nitrocellulose is desirably slightly more than the height of the longest dendrite or protuberance projecting above the photoresist coating on the silicon wafer substrate. When the photomask is then placed in contact with the silicon wafer for contact printing, the nitrocellulose layer acts to space the mask and wafer and prevent scratching. In addition, the nitrocellulose layer allows the mask and wafer to be readily parted without sticking after the printing operation. However, the layer of nitrocellulose can be somewhat less in thickness than that of the longest dendrite. In this alternative, most of the dendrites will be covered and any damage would be minimal.

OBJECTS OF THE INVENTION

An object of the invention is to provide a means to avoid scratching of a masking layer of a photomask by a substrate.

Another object of the invention is to provide a means which allows a photomask to be easily parted without sticking to a substrate.

A still further object of the invention is to provide a nitrocellulose coating on a masking layer of a photographic mask.

Another object of the invention is to provide a nitrocellulose coating on a hard surface such as iron oxide masking layer of a photomask.

Yet another object of the invention is to provide a nitrocellulose coating on a hard masking layer of a photomask having a thickness greater than the projecting height of dendrites or protuberances on the substrate wafer or somewhat less than such projecting height.

It is still another object of the present invention to provide a contact printing composite for IC manufacture comprising a silicon wafer substrate having a photoresist layer thereon, a nitrocellulose film having a thickness somewhat greater than any dendrites or protuberances projecting from the substrate above the photoresist layer, an iron oxide or other hard coating masking layer on a photomask and a glass substrate for the photomask.

Further objects of the invention will become apparent from the following detailed description.

DETAILED DESCRIPTION OF THE INVENTION

Silicon wafers employed in IC manufacture may have dentrites or protuberances present on their surface which may be as much as 0.003 inch or 76.2 microns in height. Since the thickness of the photoresist layer on the silicon wafer is from 0.2 to 0.8 micron, the dendrites or protruberances may project as much as 76 microns above the surface of the photoresist.

The photomask employed in the contact printing process with the silicon wafer has a hard masking layer on a transparent substrate, such as glass. While the masking layer disclosed herein is iron oxide, it may be any other hard layer employed in the IC industry, such as chromium, chromium oxide, polysilicon, etc.

To prevent scratching of the masking layer by any dendrites or protrusions projecting from the silicon wafer and to obviate any sticking of the photoresist of the photomask, in one modification the latter is coated with a thin transparent layer of nitrocellulose having a thickness slightly greater than the projection of the longest dendrite or protrusion above the photoresist layer. When the nitrocellulose layer is placed in contact with the photoresist layer of the silicon wafer, any rounded protrusions will be blanketed by the nitrocellulose layer while sharp, acicular dendrites may penetrate the nitrocellulose layer but would not reach the masking layer of the photomask.

The nitrocellulose layer is made by spin coating the masking layer surface of the photomask with a solution of nitrocellulose in a suitable solvent, air drying and, if desired, further cured by heating at 105°C. The nitrocellulose solution should be clear, i.e., free of any solid particles. Amyl acetate is suitable as the solvent, although the other common solvents for nitrocellulose, e.g., acetone, methanol, or a mixture of alcohol and ether may be employed. The preferred concentration is about 6.5–8 percent but may vary from about 1 to about 10 percent by weight.

The following example illustrates one method of coating a photomask with nitrocellulose.

EXAMPLE

An eyedropper full (about 2cc) of a 6 ½ percent (by weight) solution of nitrocellulose in amyl acetate was placed in the center of a 2 ½ in. × 2 ½ in. photomask consisting of an iron oxide masking layer over a glass substrate. The photomask was spun at 1500 RPM for 30 seconds, air dried and then cured at 105°C. for 1 hour. The nitrocellulose film had a center thickness of 1.90 microns and a thickness of 1.83 and 1.95 microns at the edges.

Use of more concentrated solutions and a slower rotational speed results in thicker films. Thicker films also may be made by repeating the coating steps.

What is claimed is:

1. In a combination useful in the production of integrated circuits by a photolithographic process;

a silicon wafer;

a photoresist coating on said wafer, said wafer having dendrites or protuberances projecting above the photoresist surface;

a photomask comprising a transparent substrate member having a hard masking layer thereon;

a thin coating of nitrocellulose on said masking layer;

the thickness of said nitrocellulose coating being from slightly less to at least slightly more than the height of the longest dendrite or protuberance projecting above the photoresist layer on the silicon wafer; and the said nitrocellulose coating contacting the said photoresist layer.

2. The article of claim 1 wherein the nitrocellulose coating is slightly less than the height of said longest dendrite and is less than 75 microns in thickness.

3. The article of claim 1 wherein the nitrocellulose coating is at most about slightly more than the height of said longest dendrite and is slightly more than 75 microns in thickness.

4. The article of claim 2 wherein the substrate member is glass, and the nitrocellulose coating is in contact with the photoresist layer in the silicon wafer.

5. The article of claim 3 wherein the substrate member is glass, and the nitrocellulose coating is in contact with the photoresist layer in the silicon wafer.

6. The article of claim 4 wherein the hard photomask layer comprises chromium.

7. The article of claim 4 wherein the hard photomask layer comprises chromium oxide.

8. The article of claim 4 wherein the hard photomask comprises iron oxide.

9. The article of claim 5 wherein the hard photomask layer comprises chromium.

10. The article of claim 5 wherein the hard photomask layer comprises chromium oxide.

11. The article of claim 5 wherein the hard photomask layer comprises iron oxide.

12. In the production of integrated circuits by a photolithographic process comprising the steps of coating a silicon wafer with a photoresist, forming a photomask on a transparent substrate, coating said photomask with a hard masking layer, and placing said photoresist in juxtaposition with said hard masking layer; the improvement which comprises:

coating the masking layer with a thin layer of nitrocellulose having a thickness of from slightly less to at least slightly more than the height of dendrites or protuberances on the silicon wafer projecting above the photoresist; and placing the photoresist layer in direct contact with said layer of nitrocellulose on the masking layer, whereby scratching of the masking layer is substantially prevented.

13. The method of claim 12 wherein the hard masking layer is coated with nitrocellulose by the steps comprising evenly distributing a solution of nitrocellulose over the surface of the masking layer and evaporating the solvent from said solutions.

14. The method of claim 12 wherein the hard masking layer comprises iron oxide.

15. The method of claim 12 wherein the hard masking layer comprises chromium.

16. The method of claim 12 wherein the hard masking layer comprises chromium oxide.

* * * * *